(12) United States Patent
Woolf

(10) Patent No.: US 8,242,348 B2
(45) Date of Patent: Aug. 14, 2012

(54) METHODS OF MANUFACTURING QUANTUM WELL MATERIALS

(75) Inventor: Lawrence D. Woolf, Carlsbad, CA (US)

(73) Assignee: General Atomics, San Diego, CA (US)

( * ) Notice: Subject to any disclaimer, the term of this patent is extended or adjusted under 35 U.S.C. 154(b) by 606 days.

(21) Appl. No.: 12/547,198

(22) Filed: Aug. 25, 2009

(65) Prior Publication Data
US 2011/0053359 A1 Mar. 3, 2011

(51) Int. Cl.
*H01L 35/34* (2006.01)
(52) U.S. Cl. .......... 136/201; 136/205; 204/192.12; 204/192.25; 257/14
(58) Field of Classification Search .......... 136/201, 136/205; 204/192.12, 192.25; 257/14
See application file for complete search history.

(56) References Cited

U.S. PATENT DOCUMENTS

| | | | |
|---|---|---|---|
| 5,436,467 A | 7/1995 | Elsner et al. | |
| 5,550,387 A | 8/1996 | Elsner et al. | |
| 5,814,367 A | 9/1998 | Hubbard et al. | |
| 5,856,210 A | 1/1999 | Leavitt et al. | |
| 6,033,782 A | 3/2000 | Hubbard et al. | |
| 6,096,964 A | 8/2000 | Ghamaty et al. | |
| 6,096,965 A | 8/2000 | Ghamaty et al. | |
| 6,288,837 B1 | 9/2001 | Hubbard | |
| 7,038,234 B2 | 5/2006 | Ghamaty et al. | |
| 2006/0622404 | 11/2006 | Hiller et al. | |
| 2009/0084421 A1* | 4/2009 | Olsen et al. ........... | 136/201 |

OTHER PUBLICATIONS

Javanovic et al., "Design and Fabrication of Quantum Well Thermoelectric Energy-Harvesting Power Supply for Navy Wireless Sensors," Proc. of InterPACK 2005, ASME Technical Conference on Packaging of MEMS, NEMS and Electronic Systems, Jul. 17-22, 2005, pp. 1-6.
Ghamaty et al., "Quantum Well Thermoelectric Devices," Proc. of InterPACK 2005, ASME Technical Conference on Packaging of MEMS, NEMS and Electronic Systems, Jul. 17-22, 2005, pp. 1-6.
Norbert B. Elsner, "Quantum Well Thermoelectrics," ASME Interpack 2005 Panel Discussion Solid State Power Generation and Refrigeration, The ASME/Pacilic Rim Technical Conference and Exhibition on Integration and Packaging of MEMS, NEMS, and Electronic Systems, Jul. 17-22, 2005, pp. 1-14.
John W. Fairbanks, "The Opportunities for Near Term and Long Term Thermoelectric Applications in Transportation,"Materials and Technologies for Direct Thermal-to-Electric Energy Conversion, MRS Conference, Nov. 28, 2005, pp. 1-86.

* cited by examiner

*Primary Examiner* — Bac Au
(74) *Attorney, Agent, or Firm* — Perkins Coie LLP

(57) ABSTRACT

Processes for economical large scale commercial production of blocks of quantum well particles, platelets, or continuous sheets of material imparting minimal or essentially no parasitic substrate loss in quantum well devices such as thermoelectric generators in which the blocks are embodied involve roll to roll processing, i.e., deposition and crystallization of alternating layers of quantum well materials, on an elongate and continuous base layer of appreciable width. Blocks of quantum well materials having no attached base layer are produced on decomposable or release treated base layers.

22 Claims, 4 Drawing Sheets

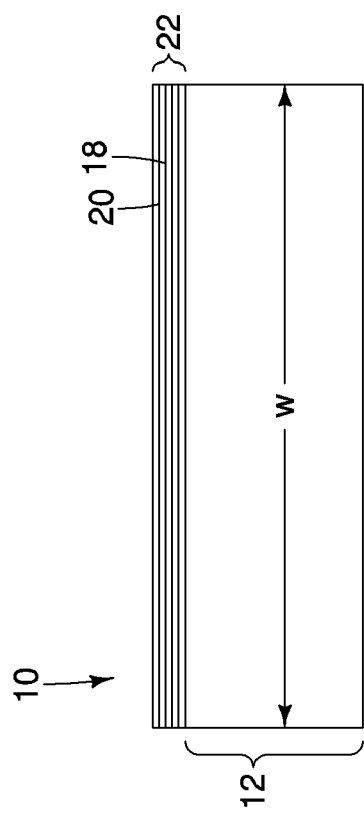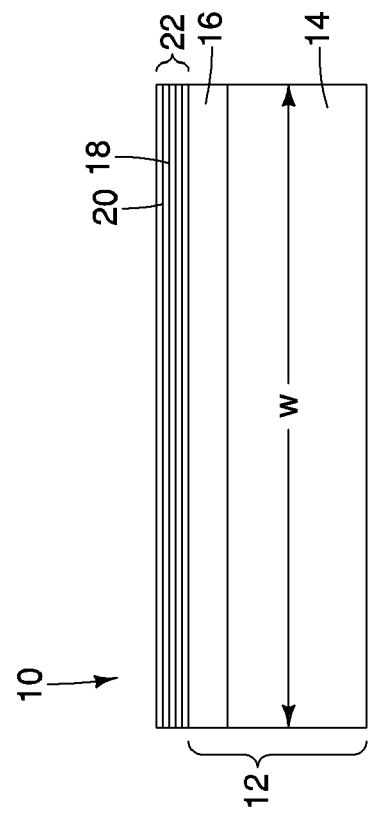

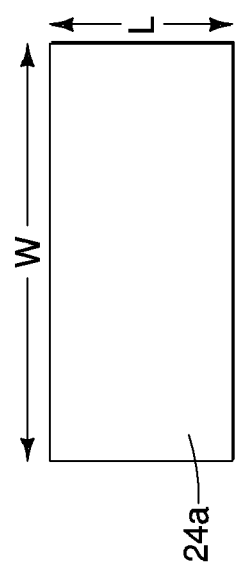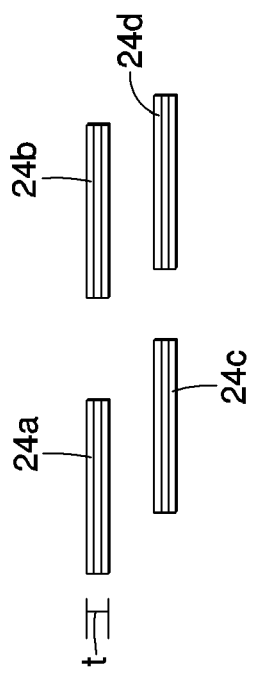

METHODS OF MANUFACTURING QUANTUM WELL MATERIALS

FIELD OF THE INVENTION

The present invention relates to the manufacture of quantum well materials for use, for example, in thermoelectric generators and like devices.

BACKGROUND

Quantum well materials for use in thermoelectric generators and other similar applications are comprised of a substrate bearing hundreds or thousands of alternating layers of two semiconductor materials having the same or similar crystalline structures, one semiconductor material serving as a barrier material and the other serving as a conducting material. Typical semiconductor pairs are silicon/silicon-germanium alloy (Si/SiGe), boron/boron-carbon alloy (B/B—C), two different boron-carbon alloys such as $B_4C/B_9C$, and silicon/silicon carbide (Si/SiC).

Conventional methods for depositing alternating layers of semiconductor pairs onto a substrate are thermal vapor deposition, electron beam deposition, molecular beam epitaxy and magnetron sputtering. Methods of depositing multiple layers of the pairs of materials from respective sources onto a reciprocated narrow tape-like substrate have been proposed. However, deposition is more usually performed with box coaters on static substrates of small size, for example, one foot square. These methods are very costly and are not scalable to large size substrates or to cost effective mass production of large quantities of quantum well materials.

The substrate employed in a quantum well material for thermoelectric applications is preferably a material having low thermal and electrical conductance. Silicon was often the material of choice for non-roll-to-roll coatings but Kapton® polyimide film for cost effective large scale production is preferred. However, in thermoelectric generators, the presence of a substrate in a quantum well material becomes a parasitic loss in the system. It would be desirable, if possible, to minimize this parasitic loss, preferably by eliminating the substrate altogether.

U.S. Pat. Nos. 5,814,367, 6,033,782 and 6,288,837, which are owned by the assignee of the present invention, disclose methods of making single and multi-layer magnetodielectric compositions, optical thin films and signature and energy control films and compositions with and without a supporting substrate.

U.S. Pat. Nos. 6,096,964, 6,096,965, 5,550,387, and 5,436,467 provide further background information in the use and theory of quantum well thermoelectrics.

SUMMARY OF THE INVENTION

The present invention, in part, adapts the above-described methods to economical, large scale production of significantly improved quantum well materials.

Methods are disclosed for economical, large scale production of quantum well materials offering minimal or essentially no parasitic substrate loss.

Further, methods are disclosed for large scale production of quantum well materials having no substrate and thus imparting no, or essentially no, parasitic loss when embodied in thermoelectric generator systems.

A number of approaches to cost-effective commercial fabrication of quantum well materials employing roll to roll web coating onto wide substrates are disclosed.

Additionally, post deposition crystallization treatments are incorporated to enhance crystallization of the deposited layers and to facilitate large scale economical production.

These and other advantages of the invention will become apparent to persons of reasonable skill in the art from the following detailed description, as considered in conjunction with the accompanying schematic drawings.

BRIEF DESCRIPTION OF THE DRAWINGS

FIG. 1a is a cross-section of one embodiment of a quantum well coated substrate;

FIG. 1b is a cross-section of another embodiment of a quantum well coated substrate;

FIG. 2 shows a cross-section of the quantum well structure of FIG. 1a;

FIG. 3a shows a portion of the quantum well structure of FIG. 2 after being formed into small particles;

FIG. 3b shows a plan view of one of the small particles of FIG. 3a;

DETAILED DESCRIPTION OF PREFERRED EMBODIMENTS

The following is a detailed description of certain embodiments of the invention presently contemplated by the inventor to be the best mode of carrying out his invention.

The quantum well materials produced by practice of the methods and/or processes of the invention are not here illustrated as they are generally conventional and well-known in the art. See, e.g., U.S. Pat. No. 7,038,234. In essence, quantum wells are comprised of hundreds or thousands of alternating layers of compatible semiconductor pairs, as explained above. Similarly, the equipment employed for practice of the invention is generally known in the art and for this reason is here illustrated only schematically and representatively.

Turning now to FIGS. 1a and 1b, embodiments of methods of manufacturing a quantum well coated substrate, shown generally as 10, include providing a base layer 12. The base layer 12 is a film that is soluble in a solution, such as heated water or a solvent. The temperature at which the base layer 12 is soluble in heated water varies depending on the material used for the base layer, as is known to those skilled in the art. The embodiment shown in FIG. 1b is similar to the embodiment shown in FIG. 1a except for the base layer 12 being formed as two layers. The base layer 12 in FIG. 1b is formed as a substrate 14 having a release layer 16 deposited directly thereon. The use of a base substrate 12 as a single layer or two layers will depend on many factors, such as the final selected application of the quantum well materials.

Figure 5:
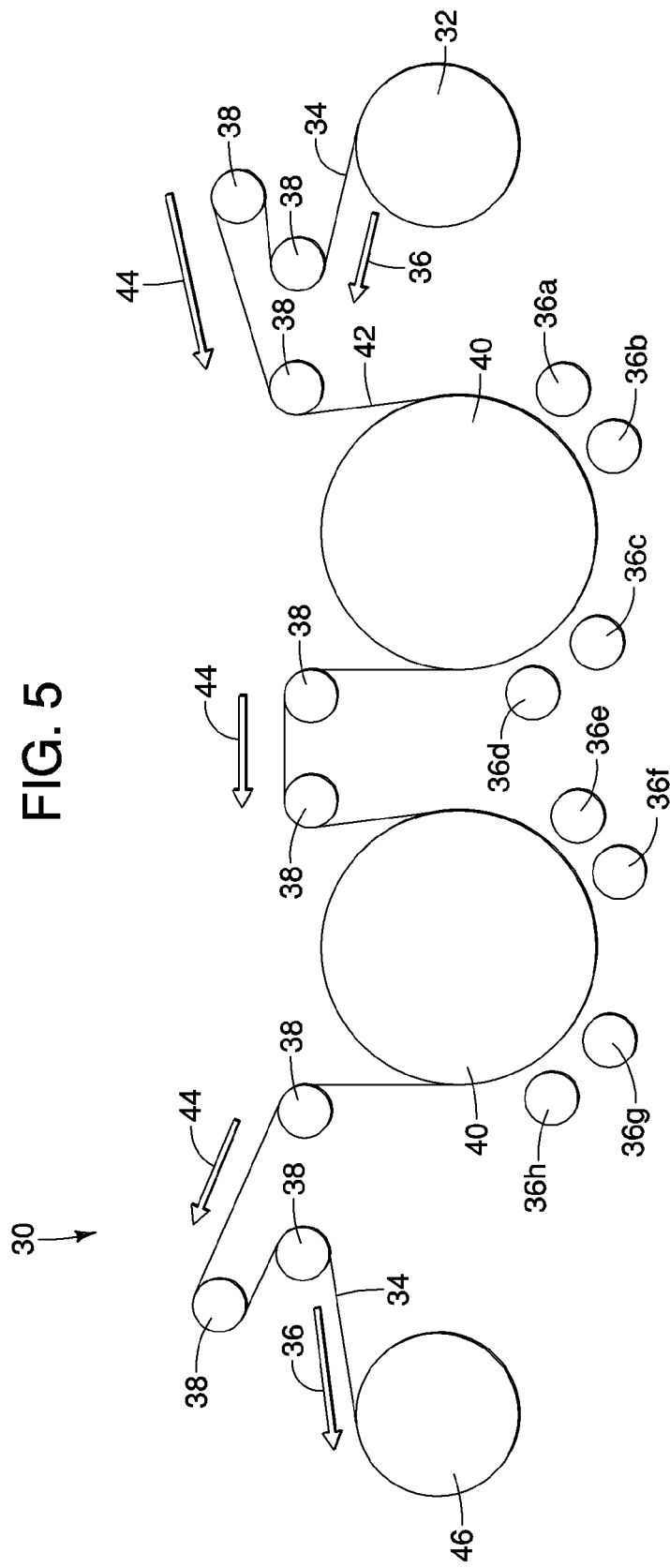
FIG. 5 is a schematic illustration of equipment representative of equipment that is suitable for practice of the invention.

As further shown in FIGS. 1a and 1b, the base layer 12 has a plurality of layers of first quantum well material 18 (white lines) alternatively stacked with a plurality of layers of a second quantum well material 20 (black lines). As discussed earlier, depending upon the selected application, the number of alternating layers can be anywhere from two to multiple millions of layers. In some embodiments, the layers of quantum well materials are formed of layers of quantum well thermoelectric materials. The alternating stack of first and second quantum well materials 18, 20 as discussed with respect to the equipment of FIG. 5 are layered onto the base layer 12 to form a quantum well structure 22.

It is desirable to separate the quantum well structure 22 from the base layer 12. This is because the base layer 12 limits the temperature at which the quantum well structure 22 can be heat treated. If the quantum well structure 22 is separately heat treated, then the quantum well structure can attain a desired crystallinity which optimizes the properties of the structure. Moreover, once the quantum well structure 22 is combined with other quantum well structures to build a quantum well device, then the properties of the quantum well structure are provided to the device. Thus, for quantum well devices without base layers 12, such devices can be used at higher temperatures since no base layers are present. The uppermost temperature range of such quantum well devices is determined by the quantum well materials 18, 20 forming the quantum well structure 22.

Furthermore, a quantum well structure 22 that is separated from a base layer 12 results in an increase in the volume fraction of quantum well materials forming a quantum well device from the quantum well structures. The efficiency and performance of a quantum well device depends, among other things, on the amount of quantum well materials in the final constructed device. When a base layer 12 attached to the quantum well structure 22 is used to construct a quantum well device, then the volume fraction of quantum well material in the device is reduced and performance is degraded. By way of example, a 10 micron thick base layer 10 having a 10 micron thick quantum well structure 22 has a 50% volume efficiency when forming a quantum well device as that of a 10 micron thick quantum well structure that has no base layer 12 attached thereto.

As discussed above, the base layer 12 is decomposable (FIG. 1a) or release treated (FIG. 1b), which allows the multilayer quantum well structure 22 to be separated from the base layer after the first and second quantum well materials 18, 20 have been applied to the base layer. Generally, the base layer 12 is designed to be as wide as the coating system described in FIG. 5, and preferably has a width (w) of one to seven feet. While polyvinyl alcohol (PVA) release coated Mylar film is contemplated as being used as the preferred release coated substrate for the embodiment shown in FIG. 1b, other non-release coated materials can be used for the embodiment of FIG. 1a if the non-release coated materials can be dissolved in a solvent, or can be combusted or decomposed in a manner that does not degrade the ability of the coating to be used for its final application.

In one embodiment, the release layer 16, preferably having a thickness of about 5 microns is formed on the substrate 14, which is a Mylar film that is preferably 2-3 mils thick. Preferably, the release layer 16 is a water soluble coating, such as a polyvinyl alcohol (PVA), which can dissolve in water generally heated to about 150° F. The release layer 16 can dissolve in an organic solvent or other type of solvent. The release layer 16 is formed as an intermediate layer located between the substrate 14 and alternating layers of quantum well materials 18, 20 that are coated on the release layer. The release layer 16 may be formed as a smooth film or alternatively as a rough film. The release layer is a rough film due to particles of materials such as silica being contained within the release film. For example, in one embodiment silica particles having diameters of 3 to 5 microns are provided in the rough film. An advantage of a rough release layer 16 is that subsequent coatings of quantum well materials 18, 20 applied to the rough release layer may according to the selected quantum well materials adhere better to the substrate 14. Another advantage is that the roughness of the release layer 16 results in a desired lower thermal conductivity of the quantum well structure 22 formed on the release layer.

In other embodiments, other removable materials, such as a water soluble PVA film made by Monosol® or a polyvinyl butyral (PVB) based film, which combusts/decomposes at a temperature of about 400 C, are also contemplated and can be used as a base layer 12.

The layers of quantum well materials 18, 20 collectively form the quantum well structure 22. Each of the individual layers of the first and second quantum well materials 18, 20 preferably has a thickness of about 10 nm. The quantum well structure 22 generally has a thickness (t) of about 100 nm to 25,000 nm depending on the number of alternating layers of quantum well material 18, 20 coated onto the base layer 12. Preferably, the thickness (t) of the quantum well structure 22 is about 1 micron to about 10 microns. However, other thicknesses for the layers of quantum well materials 18, 20 and hence the quantum well structure are contemplated depending upon the desired final application of the quantum well material as is known to a skilled artisan.

FIG. 1b shows the quantum well structure 22 wherein the coated layers of quantum well materials 18, 20 are formed on the substrate 14 with the intermediate release layer 16 therebetween. Once each of the alternating coated layers of quantum well materials 18, 20 are formed to the desired thickness, the quantum well structure 22 is separated from the substrate 14.

FIG. 2 shows the quantum well structure 22 separated from the base layer 12. Depending upon a desired application, the quantum well structure 22 can be separated as quantum well structure portions in the form of one or more of a continuous sheet, individual platelets, and particles. Although particles is hereinafter used as an exemplary embodiment, particles can interchanged for platelets or a continuous sheet.

For embodiments employing a release layer 16, the release layer is dissolved by soaking the release layer in water for water soluble release materials, or alternatively by dissolving a solvent-soluble release layer using an appropriate solvent. For a base layer 12 that is soluble and has no release layer 16, the substrate is dissolved in a solvent. As discussed above, for a PVA film hot water can be used to separate the quantum well structure 22 from the base layer 12. For a base layer that decomposes or combusts, such as a PVB film, the quantum well coated substrate 10 is heated in an oven, and the decomposable/combustible base layer 12 is decomposed/combusted and the quantum well structure 22 remains.

Once the quantum well structure 22 is removed from the base layer 12, the quantum well structure is preferably ground into small particles 24a-d as shown in FIG. 3a. Each of the small particles 24a-d preferably has the same number of alternating layers of quantum well materials 18, 20 as the quantum well structure 22. This facilitates consolidation of the small particles 24a-d in a later process step. Although only four small particles 24a-d are illustrated in FIG. 3a, it is understood that the number of small particles created will vary depending upon a variety of factors, such as the initial size of the quantum well structure 22.

The quantum well structure 22 can be ground into small particles 24a-d by any one of many processes such as those known in the ceramics, paint, and ink industries. Some exemplary processes are ball milling, attritor milling, air impact pulverizing, and conical milling. However, for some applications, it may be more preferable for the quantum well structure 22 to be removed from the base layer 12 as individual platelets or continuous sheets. These platelets or sheets can then be processed in a manner similar to that described below for the small particles 24a-d.

FIG. 3b is a plan view of the one of the small particles 24a of the ground quantum well structure 22 of FIG. 3a. The small particle 24a generally has a width (W) less than the width (w) of the base layer 12. The small particle also has a length (L). While one small particle 24a is illustrated, it is understood that other small particles will have similar dimensioned widths and lengths that may or may not be equivalent to those of the small particle 24a. However, regardless of such differences in the widths (W) and the lengths (L) of the various small particles 24a-d, each of the small particles have widths and lengths that result in an aspect ratio of the small particles being greater than 100. The aspect ratio of a small particle 24a-d is defined as the width (W) of a particle divided by the thickness (t) of the particle or alternatively as the length (L) of a particle divided by the thickness (t) of the particle.

Figure 4:
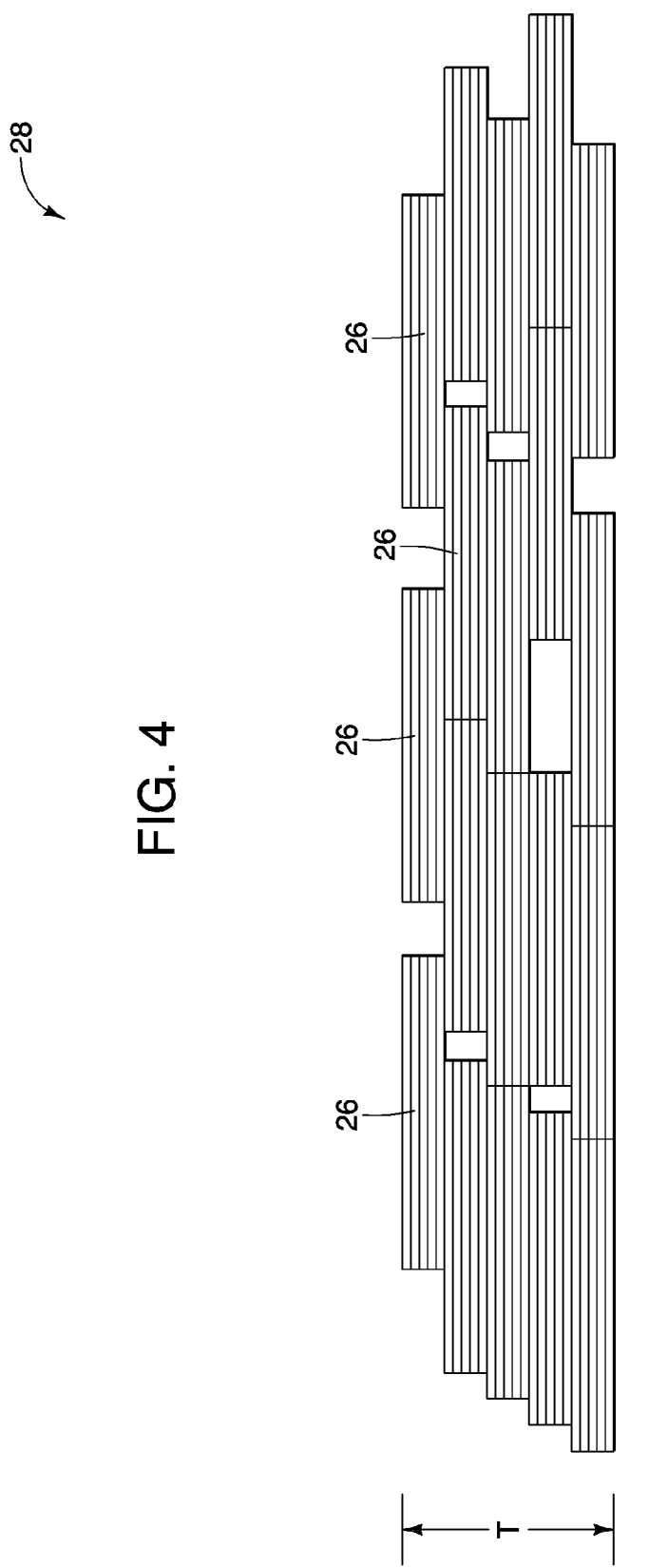
FIG. 4 shows small particles formed as a block of quantum well particles.

FIG. 4 shows small particles 26 being rearranged and consolidated into a block of quantum well particles 28. In one embodiment, since the small particles 26 have large aspect ratios, with longitudinal (L) and width (W) dimensions being at least 100 times greater than the thickness (t), the small particles can be compressed together using a standard press or mold. Because of their high aspect ratio, the small particles 26 tend to align and lay in a pancaked fashion as shown in FIG. 4, with all the large dimensions length (L) and width (W) arranged nearly parallel to each other and the thickness (T) of the block of quantum well particles 28 being defined by the thickness of the small particles 26.

The small particles 26 may be cold pressed together or hot pressed together. A thermal treatment, including a standard oven treatment or rapid thermal processing can be applied to the small particles 26 before and/or during and/or after pressing according to the materials being processed Hot isostatic pressing (HIPing) is another type of thermal treatment method capable of being used on the small particles 26. Moreover, as understood by skilled artisans, higher melting point materials forming the small particles 26 generally will require higher heat treatment temperatures. Typical heat treatment temperatures will range from 500 C to 2000 C. Preferably, the block of quantum well particles 28 has a thickness in the range of about 1 to 10 mm.

The ability to remove the quantum well structure 22 from the base layer 12 and consolidate the small particles 26 into thicker materials is advantageous. This ability allows the thermal treatments required to form a desired crystalline structure to be developed within each individual layer of the quantum well structure. Moreover, the thermal treatments are not constrained by a temperature limit imposed by the base layer 12 onto which the first and second quantum well layers 18, 20 were originally coated. Therefore, thick blocks of quantum well particles 28 can be made. The process is also advantageous over known prior art processes because standard processing techniques that were unable to form quantum well materials and devices due to temperature constraints imposed by the base layer can now be implemented since quantum well materials function at higher temperatures than materials forming the base layer. Finally, the blocks of quantum well particles 28 can be combined with other blocks of quantum well particles and then oriented and arranged in configurations most advantageous to a desired application. One such application is when the blocks are arranged for use as a thermoelectric material. It will be appreciated by those versed in the art of thermoelectric design that electrical contacts will be required on opposing surfaces of combined blocks of quantum well particles to make appropriate electrical contact to layers of the quantum well materials 18, 20.

Typically, for practice of the present invention as shown in FIG. 5, the equipment, shown generally as 30, includes a supply spool 32 for receiving a roll of base layer material 34 of significant length and appreciable width and for dispensing or paying the base layer out as a continuous web. One or more and preferably several deposition stations 36a-h through which the base layer 34 is passed are provided for deposition thereon of alternating layers of the desired quantum well coating materials. Depending upon the desired thicknesses of the quantum well coating layers, speed of the base layer 34 as it passes by the deposition stations 36a-h, number of layers of quantum well materials to be deposited, etc., will determine how the deposition stations 36a-h operate. For example, the deposition stations 36a-h can be controlled by a control (not shown) so as to alternately deposit a layer of quantum well material 18 at deposition stations 36a-d followed by a second layer of quantum layer material 20 at each deposition stations 36e-h.

The equipment 30 also includes a plurality of guide rollers 38 and a pair of heated chill drums 40. The guide rollers 38 and chill drums 40 are provided for guiding and chilling the uncoated, partially coated or fully coated base layer 34. The number of guide rollers 38 and chill drums 40 implemented with the equipment 30 can be one or more depending on the particular equipment design.

The guide rollers 38 are preferably sufficiently large in diameter such that the coatings provided by the deposition stations 34a-h do not crack when the outer surface 42 of the base layer 34 travels along guide rollers 38. Arrows 44 show the movement of the base layer or web 24 as it unwinds from the supply spool 32 and is collected on a take-up spool 46. Once the base layer 34 has unwound from the supply spool 32, the direction of movement of the base layer is reversed opposite to that of arrows 44 such that the base layer now passes from the take-up spool 46 to the supply spool 32. In this manner, the base layer 34 can continuously move around the chill drums 40 and have layers of quantum well materials deposited on the base layer using the deposition stations 36a-h. Accordingly, multiple layers of quantum well materials 18, 20 can be layered onto the base layer 34 by conducting multiple back and forth passes between the spools 32, 46 (i.e., winding and unwinding the base layer from the spools 32, 46 and selectively applying layers of quantum well materials from the deposition stations 36a-h).

The preferred embodiments of the finished blocks of quantum well particles produced in accordance with the invention have no substrate and thus do not impose a parasitic loss on quantum well devices, such as thermoelectric generator systems, in which they are embodied. For production of these substrate-free or substrate-less blocks of quantum well particles, almost any polymer base layer of selected thickness and width may be utilized for production and processing of blocks of quantum well particles. The base layer must have the characteristics described previously, such as containing a water soluble release coating on its surface for embodiment utilizing a release layer 16.

Any one or more of the known deposition techniques may be employed at the deposition stations 36a-h for practice of the present invention, i.e., chemical vapor deposition, electron beam deposition, molecular beam epitaxy and magnetron sputtering. Magnetron sputtering is presently preferred.

In accordance with the invention, deposition may be accompanied by, and supplemented and enhanced by, a process step that promotes rapid crystallization of the thin film coatings of layers of quantum well materials 18, 20 deposited on the substrate at the deposition stations 36a-h. Laser crystallization or other rapid thermal processing techniques may be employed if desired, but heat treatment is currently preferred for hastening crystallization of the deposited layers 18, 20. The heat treatment can be performed by using heat lamps, by using a heated "chill drum" such as one that is heated by hot oil, or by adjusting the sputtering power, the coating speed, the degree of thermal contact of the base layer 34 with the "chill drum", and other processing parameters that result in sufficient heat being deposited onto the base layer so that the temperature of the coatings 18, 20 are sufficiently high to result in the desired material properties. High temperature processing would require the use of a high temperature capable plastic film such as a polyimide film, commercially available as Kapton® film, or another high temperature commercial plastic film as a base layer 34. Thermal conditioning is preferably carried out contemporaneously with deposition as the base layer 34 is transported from the supply spool 32 to the take-up spool 46 and back again.

Quantum well materials for use as building blocks for quantum well devices may also be produced by employing one or more of the above described methods to form subunit sheets, platelets, or pigments each comprising a fraction, e.g., $1/10^{th}$, $1/50^{th}$, $1/100^{th}$, etc., of the total number of layers required and then cold pressing and sintering, laminating, hot pressing or hot isostatically pressing (HIPing) a plurality of the subunits e.g., 10, 50, 100, etc., into a composite unitary quantum well structure having the desired number of layers. Alternatively and/or additionally a plurality (the requisite number) of subunit pigment particles may be placed in a mold or die and molded or cast under heat and/or pressure into a molded or cast quantum well unit, device or product.

The invention thus provides improved quantum well products and processes for economical, commercial scale, roll to roll production of the same on wide continuous webs or base layers. The quantum well materials may be formed of any desired or required number of layers, and may be produced in substantially any desired or required form, shape or size. Advantageously, the processes discussed herein allow thick structures to be made by consolidating layers of quantum well materials into thicker structures that can have optimized shapes for a particular application.

While certain presently preferred embodiments of the invention have been herein described, it is to be appreciated that variations, changes and modifications may be made therein without departing from the scope of the invention, as defined by the appended claims.

What is claimed:

1. A process for producing a block of quantum well particles comprising the steps of:
    providing a base layer;
    forming a plurality of layers of quantum well materials on said base layer;
    separating said layers of quantum well materials from said base layer;
    forming said layers of quantum well materials into a plurality of multilayered particles;
    consolidating said multilayered particles to form the block of quantum well particles.

2. The process of claim 1, further comprising the step of heating the multilayered particles prior to the consolidating step.

3. The process of claim 1, further comprising the step of heating the multilayered particles during the consolidating step.

4. The process of claim 1, further comprising the step of heating the multilayered particles after the consolidating step.

5. The process of claim 1, wherein said base layer comprises a substrate and a release layer formed directly on said substrate.

6. The process of claim 5, wherein said substrate is a plastic film.

7. The process of claim 5, wherein said release layer is water soluble.

8. The process of claim 5, wherein said release layer has a rough surface.

9. The process of claim 5, wherein said release layer is soluble in a solvent.

10. The process of claim 1, wherein said step of separating said layers of quantum well materials from said base layer comprises dissolving said base layer in a solvent.

11. The process of claim 1, wherein said step of separating said layers of quantum well materials from said base layer comprises thermally decomposing said base layer.

12. The process of claim 1, wherein said layers of quantum well materials are layers of quantum well thermoelectric materials.

13. The process of claim 1, wherein said layers of quantum well materials each has a thickness of about 1 micron to about 10 microns.

14. The process of claim 1, wherein said multilayered particles have an aspect ratio greater than or equal to 100, a width (W) of about 10 microns to 1 meter, and a length (L) of about 10 microns to 1 meter.

15. A process of producing a block of quantum well particles comprising the steps of:
    providing an elongate continuous substrate of appreciable width;
    providing a release layer on said substrate;
    providing one or more stations for depositing quantum well materials onto substantially said full width of said substrate;
    passing said substrate through each deposition station and depositing a coating of quantum well materials onto said release layer at each deposition station to form a plurality of layers of quantum well materials;
    separating said plurality of layers of quantum well materials from said substrate and said release layer to form portions of said layers of quantum well materials; and
    stacking said portions to form the block of quantum well particles.

16. The process of claim 15, further comprising the step of providing one or more heated chill drums for crystallizing said layers of quantum well materials deposited on said release layer.

17. The process of claim 15, further comprising the step of passing the substrate through each deposition station and initiating crystallizing of said coating on said substrate.

18. The process of claim 15, further comprising the step of heating said layers of quantum well materials prior to said stacking step.

19. The process of claim 18, wherein said heating is performed using a furnace, oven, heat lamp, laser, hot press, or hot isostatic press.

20. The process of claim 15, wherein depositing of said layers of quantum well materials onto said release layer is performed by one or more of magnetron sputtering, electron beam deposition, molecular beam epitaxy, or chemical vapor deposition.

21. The process of claim 15, wherein said layers of quantum well materials are quantum well thermoelectric materials.

22. The process of claim 15, wherein said stacked portions have a thickness of about 1 mm to about 10 mm.

* * * * *

UNITED STATES PATENT AND TRADEMARK OFFICE
CERTIFICATE OF CORRECTION

PATENT NO. : 8,242,348 B2  
APPLICATION NO. : 12/547198  
DATED : August 14, 2012  
INVENTOR(S) : Lawrence D. Woolf Page 1 of 1

It is certified that error appears in the above-identified patent and that said Letters Patent is hereby corrected as shown below:

Title Page, Item (56), under "OTHER PUBLICATIONS", in Column 2, Line 11, please delete "ASME/Pacilic" and insert -- ASME/Pacific --, therefor.

Signed and Sealed this
Sixteenth Day of October, 2012

David J. Kappos
*Director of the United States Patent and Trademark Office*